(12) United States Patent
Mizoguchi et al.

(10) Patent No.: US 12,078,685 B2
(45) Date of Patent: Sep. 3, 2024

(54) ELECTRIC LEAKAGE DETERMINATION DEVICE

(71) Applicant: DENSO CORPORATION, Kariya (JP)

(72) Inventors: Tomomichi Mizoguchi, Kariya (JP); Toru Wakimoto, Nisshin (JP)

(73) Assignee: DENSO CORPORATION, Kariya (JP)

( * ) Notice: Subject to any disclaimer, the term of this patent is extended or adjusted under 35 U.S.C. 154(b) by 487 days.

(21) Appl. No.: 17/509,155

(22) Filed: Oct. 25, 2021

(65) Prior Publication Data

US 2022/0043073 A1 Feb. 10, 2022

Related U.S. Application Data

(63) Continuation of application No. PCT/JP2020/017549, filed on Apr. 23, 2020.

(30) Foreign Application Priority Data

Apr. 24, 2019 (JP) .................... 2019-083426

(51) Int. Cl.
*G01R 31/52* (2020.01)
*H01M 10/48* (2006.01)
*H02J 7/00* (2006.01)

(52) U.S. Cl.
CPC ............ *G01R 31/52* (2020.01); *H01M 10/48* (2013.01); *H02J 7/0063* (2013.01); *H02J 7/00712* (2020.01)

(58) Field of Classification Search
CPC ...................................... G01R 31/52
See application file for complete search history.

(56) References Cited

U.S. PATENT DOCUMENTS

| | | |
|---|---|---|
| 2016/0202301 A1 | 7/2016 | Mizoguchi et al. |
| 2018/0017609 A1* | 1/2018 | Terada ..................... H02H 3/04 |
| 2018/0149689 A1* | 5/2018 | Ollitrault ............. G01R 19/257 |
| 2019/0152324 A1* | 5/2019 | Lee ....................... H02J 7/0029 |

* cited by examiner

*Primary Examiner* — Richard Isla
*Assistant Examiner* — Sadia Kousar
(74) *Attorney, Agent, or Firm* — Oliff PLC

(57) ABSTRACT

An electrical leakage determination device includes: a capacitor connected to a battery; a detection resistor connected to the capacitor; a detection unit detecting a voltage value at a connection point between the detection resistor and the capacitor; a low amplitude voltage application unit applying a low amplitude voltage to the detection resistor every driving cycle; a high amplitude voltage application unit applying, before the application of the low amplitude voltage to the detection resistor, a high amplitude voltage to the detection resistor. The device determines whether there is electrical leakage between the power supply circuit and the ground based on a peak value of the voltage value detected when the low amplitude voltage is being applied, and changes a time integral value of the high amplitude voltage applied to the detection resistor based on a change in the voltage value detected when the low amplitude voltage is being applied.

4 Claims, 13 Drawing Sheets

FIG.2
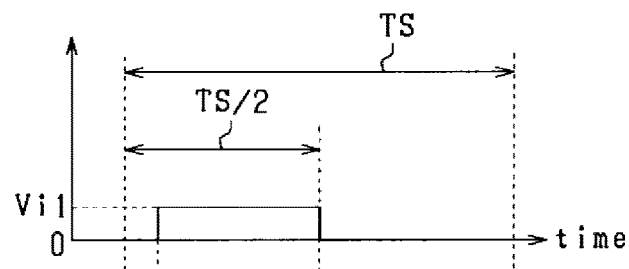
(a) Sgs
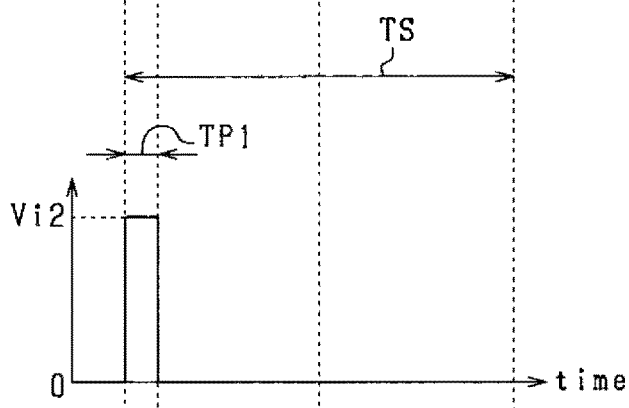
(b) Sg1
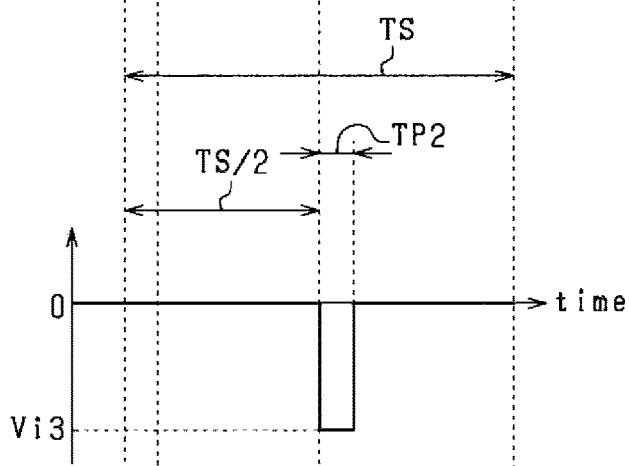
(c) Sg2
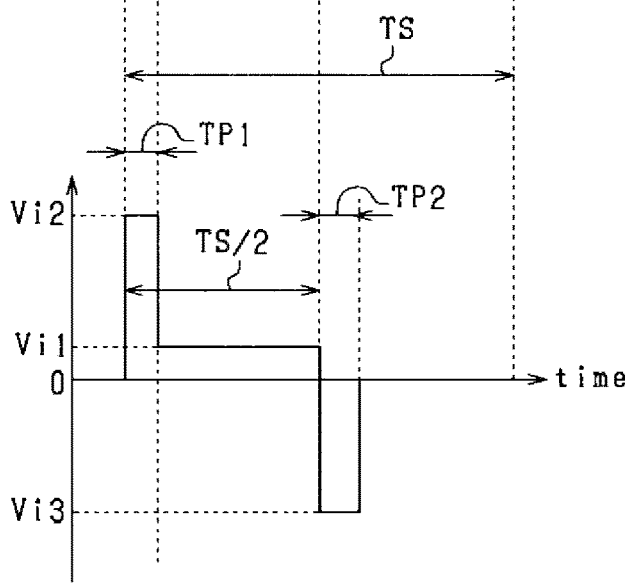
(d) Sgc

ELECTRIC LEAKAGE DETERMINATION DEVICE

CROSS-REFERENCE TO RELATED APPLICATION

The present application is based on and claims the benefit of priority from earlier Japanese Patent Application No. 2019-083426 filed Apr. 24, 2019, the description of which is incorporated herein by reference.

BACKGROUND

Technical Field

The present disclosure relates to an electrical leakage determination device applied to a power supply system including a battery and electric devices that supply and/or receive power to/from the battery. A power supply circuit including the battery and the electric devices is electrically isolated from the ground.

Related Art

This kind of electrical leakage determination device includes those devices that are applied to vehicle power supply systems in which the power supply circuit including a battery and electric devices is electrically isolated from the vehicle body serving as ground.

SUMMARY

As an aspect of the present disclosure, an electrical leakage determination device is provided which is configured to be applied to a power supply system including a battery and an electric device that performs power transfer with the battery, a power supply circuit including the battery and the electric device being electrically insulated from ground, the electrical leakage determination device comprising:
  a capacitor whose first end is connected to a positive electrode or a negative electrode of the battery;
  a detection resistor connected to a second end of the capacitor;
  a detection unit for detecting a voltage value at a connection point between the detection resistor and the capacitor;
  a low amplitude voltage application unit for applying a low amplitude voltage having a first amplitude to the detection resistor every driving cycle;
  a high amplitude voltage application unit for applying, before the application of the low amplitude voltage to the detection resistor, a high amplitude voltage having a second amplitude higher than the first amplitude and having the same polarity as the low amplitude voltage to the detection resistor for a time period that is shorter than ½ of the driving cycle;
  a determination unit for determining whether there is electrical leakage between the power supply circuit and the ground based on a peak value of the voltage value detected by the detection unit when the low amplitude voltage is being applied; and
  a variable control unit for changing a time integral value of the high amplitude voltage applied to the detection resistor based on a change in the voltage value detected by the detection unit when the low amplitude voltage is being applied.

BRIEF DESCRIPTION OF THE DRAWINGS

In the accompanying drawings:
FIG. 2 is a diagram showing a driving signal, first and second pulse signals, and a combined voltage signal.

DETAILED DESCRIPTION OF THE PREFERRED EMBODIMENTS

Figure 1:
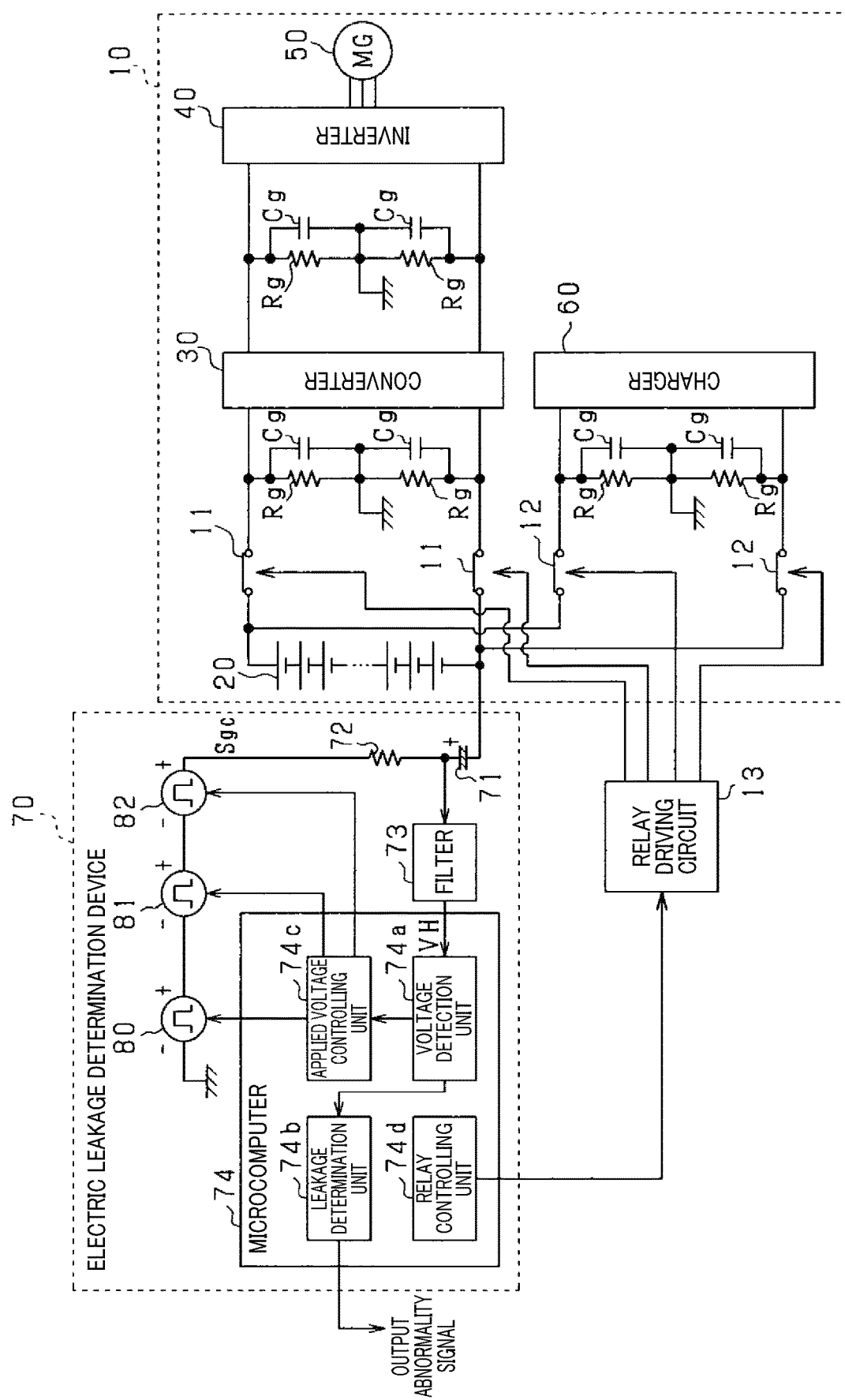
FIG. 1 is an overall configuration diagram showing an in-vehicle power supply system according to a first embodiment.

This kind of electrical leakage determination device includes those devices that are applied to vehicle power supply systems in which the power supply circuit including a battery and electric devices is electrically isolated from the vehicle body serving as ground, as described in JP 2016-128753 A. The electric devices include a DC/DC converter connected to the battery via a first relay, an inverter, a rotary electric machine, and a charger connected to the battery via a second relay.

This electrical leakage determination device outputs an AC voltage to the power supply circuit via a detection resistor and a capacitor, and detects a peak value of the AC signal generated as a result of voltage division between a detection resistance and an insulation resistance component between the power supply circuit and the vehicle body. Then, the electrical leakage determination device compares the detected peak value with a threshold to determine whether there is an electrical leakage between the power supply circuit and the vehicle body.

Here, common capacitance generated between the power supply circuit and the vehicle body changes according to the number of electric devices electrically connected to the battery. Therefore, in order to improve the accuracy in detecting an electrical leakage, the electrical leakage determination device switches the threshold used in the electrical leakage determination between two thresholds set at different values based on on/off states of the first and second relays.

To be able to switch the threshold as in the above-described electrical leakage determination device, the relationship between the number of electric devices electrically connected to the battery and the amount of common capacitance needs to be known in advance. The common capacitance changes depending on, for example, stray capacitance between windings of the rotary electric machine and a housing of the machine, capacitance of a common capacitor for noise suppression connected to input/output terminals of each electric device, and the like.

Further, even if the electric devices electrically connected to the battery are the same devices, the common capacitance may change over time because, for example, a clearance between the windings and the housing, which determines the stray capacitance, may undergo temperature changes and temporal changes, or the common capacitor may undergo temporal changes.

Thus, there can be various factors that change the common capacitance. Therefore, an electrical leakage determination device capable of improving robustness against these factors is desired.

A main objective of the present disclosure is to provide an electrical leakage determination device capable of accurately determining whether there is electrical leakage between a power supply circuit and the ground even if common capacitance generated between the power supply circuit and the ground changes.

First Embodiment

A first embodiment of an electrical leakage determination device according to the present disclosure will be described below with reference to the drawings. The electrical leakage determination device of the present embodiment is applied to a vehicle such as a hybrid vehicle or an electric vehicle capable of traveling using electric power of a battery as a traveling power source and whose battery can be charged by external power.

As shown in FIG. 1, an in-vehicle power supply system includes a power supply circuit 10 and an electrical leakage determination device 70. The power supply circuit 10 includes an assembled battery 20, a DC/DC converter 30, an inverter 40, a rotary electric machine 50, and a charger 60.

The assembled battery 20 includes a series connection of a plurality of battery cells. The battery cells may be lithium-ion cells. The terminal voltage of the assembled battery 20 is, for example, several hundred V. The DC/DC converter 30 is connected to the assembled battery 20 via a first main relay 11. Further, the charger 60 is connected to the assembled battery 20 via a second main relay 12.

When the first main relay 11 is turned on, the assembled battery 20 and the DC/DC converter 30 are electrically connected, and when the relay 11 is turned off, the battery 20 and the DC/DC converter 30 are electrically cut off. When the second main relay 12 is turned on, the assembled battery 20 and the charger 60 are electrically connected, and when the relay 12 is turned off, the assembled battery 20 and the charger 60 are electrically cut off.

When the first main relay 11 is turned on, the DC/DC converter 30 boosts the output voltage of the assembled battery 20 and supplies it to the inverter 40. The inverter 40 converts the DC power boosted by the DC/DC converter 30 into AC power and supplies it to the windings of the rotary electric machine 50.

On the other hand, when the first main relay 11 is turned on, the inverter 40 converts AC power generated by the rotary electric machine 50 into DC power and supplies it to the DC/DC converter 30. The DC/DC converter 30 steps down the output voltage of the inverter 40 and supplies it to the assembled battery 20.

When the second main relay 12 is turned on, the charger 60 charges the assembled battery 20 using an external power source as a power supply source. The second main relay 12 is turned on, for example, when the vehicle is stopped and is connected to an external power source via a charging plug (not shown).

The electrical leakage determination device 70 includes a capacitor 71 (coupling capacitor), a detection resistor 72, a filter 73, a microcomputer 74, a drive signal generation unit 80 (corresponding to a "low amplitude voltage application unit"), a first pulse generation unit 81 (corresponding to a "first high amplitude voltage application unit"), and a second pulse generating unit 82 (corresponding to a "second high amplitude voltage application unit").

The capacitor 71 galvanically isolates the power supply circuit 10 from the electrical leakage determination device 70. A first end of the capacitor 71 is connected to a negative electrode terminal of the assembled battery 20, and a second end of the capacitor 71 is connected to a first end of the detection resistor 72. The drive signal generation unit 80 and the first and second pulse generation units 81, 82 are connected to a second end of the detection resistor 72.

A voltage value at the connection point between the detection resistor 72 and the capacitor 71 is input to the filter 73. The filter 73 removes noise from the voltage value and outputs the filtered voltage value. Hereinafter, the output voltage value of the filter 73 will be referred to as a detected voltage value VH.

The microcomputer 74 includes a voltage detection unit 74a, an electrical leakage determination unit 74b, an applied voltage control unit 74c, and a relay control unit 74d. A detected voltage value VH from the filter 73 is input to the voltage detection unit 74a. The voltage detection unit 74a, the electrical leakage determination unit 74b, and the applied voltage control unit 74c will be described in detail later.

The relay control unit 74d is connected to a relay drive circuit 13 included in the power supply system. The relay drive circuit 13 receives a command signal from the relay control unit 74d and switches the first main relay 11 and the second main relay 12 on or off. More specifically, the relay control unit 74d turns on the first main relay 11 via the relay drive circuit 13 when the assembled battery 20 is to be charged with the inverter 40 driven. On the other hand, the relay control unit 74d turns on the second main relay 12 via the relay drive circuit 13 when the assembled battery 20 is to be charged by the charger 60 with the inverter 40 stopped.

The power supply circuit 10 is electrically insulated from the vehicle body serving as ground, and a ground insulation resistance (hereinafter, insulation resistance Rg) is generated between the power supply circuit 10 and the vehicle body. For example, an insulation resistance Rg is generated between the DC/DC converter 30 and the vehicle body, between the inverter 40 and the vehicle body, and between the charger 60 and the vehicle body.

In addition, since the power supply circuit 10 is electrically insulated from the vehicle body, common capacitance Cg is generated between the power supply circuit 10 and the vehicle body. For example, common capacitance Cg is generated between the DC/DC converter 30 and the vehicle body, between the inverter 40 and the vehicle body, and between the charger 60 and the vehicle body. The common capacitance Cg includes parasitic capacitance, capacitor components of various members, and the like. In FIG. 1, for convenience of explanation, equivalent circuits of the insulation resistance Rg and common capacitance Cg are shown.

Next, the drive signal generation unit 80, the first pulse generation unit 81, and the second pulse generation unit 82 will be described with reference to FIG. 2. The voltage signal shown in FIG. 2(d) is supplied to the power supply circuit 10 via the detection resistor 72 and the capacitor 71. The voltage signal shown in FIG. 2(d) is a combined voltage signal Sgc obtained by combining the voltage signals of FIGS. 2(a) to 2(c). FIG. 2(a) shows a drive signal Sgs (corresponding to a "low amplitude voltage") output from the drive signal generation unit 80, FIG. 2(b) shows a first pulse signal Sg1 (corresponding to a "first high amplitude voltage") output from the first pulse generation unit 81, and FIG. 2(c) shows a second pulse signal Sg2 (corresponding to a "second high amplitude voltage") output from the second pulse generation unit 82.

As shown in FIG. 2(a), the drive signal generation unit 80 outputs a positive drive signal Sgs having a first amplitude Vi1 every drive cycle TS (for example, 0.5 seconds) for a time period shorter than ½ of the drive cycle TS.

As shown in FIG. 2(b), the first pulse generation unit 81 outputs a positive first pulse signal Sg1 having a second amplitude Vi2 that is higher than the first amplitude Vi1 every drive cycle TS. The pulse width of the first pulse signal Sg1 (hereinafter referred to as a first pulse width TP1) is lower than the pulse width of the drive signal Sgs. In the present embodiment, the timing at which output of the first pulse signal Sg1 is started is before the timing at which output of the drive signal Sgs is started, and the timing at which output of the first pulse signal Sg1 is stopped is the same as the timing at which output of the drive signal Sgs is started.

As shown in FIG. 2(c), the second pulse generation unit 82 outputs a negative second pulse signal Sg2 having a third amplitude Vi3 that is higher than the first amplitude Vi1 every drive cycle TS. The pulse width of the second pulse signal Sg2 (hereinafter referred to as a second pulse width TP2) is smaller than the pulse width of the drive signal Sgs. In the present embodiment, the timing at which output of the second pulse signal Sg2 is started is the same as the timing at which output of the drive signal Sgs is stopped.

Controlling of output of the drive signal Sgs from the drive signal generation unit 80, controlling of output of the first pulse signal Sg1 from the first pulse generation unit 81, and controlling of output of the second pulse signal Sg2 from the second pulse generation unit 82 are carried out by the applied voltage control unit 74c.

Figure 3:
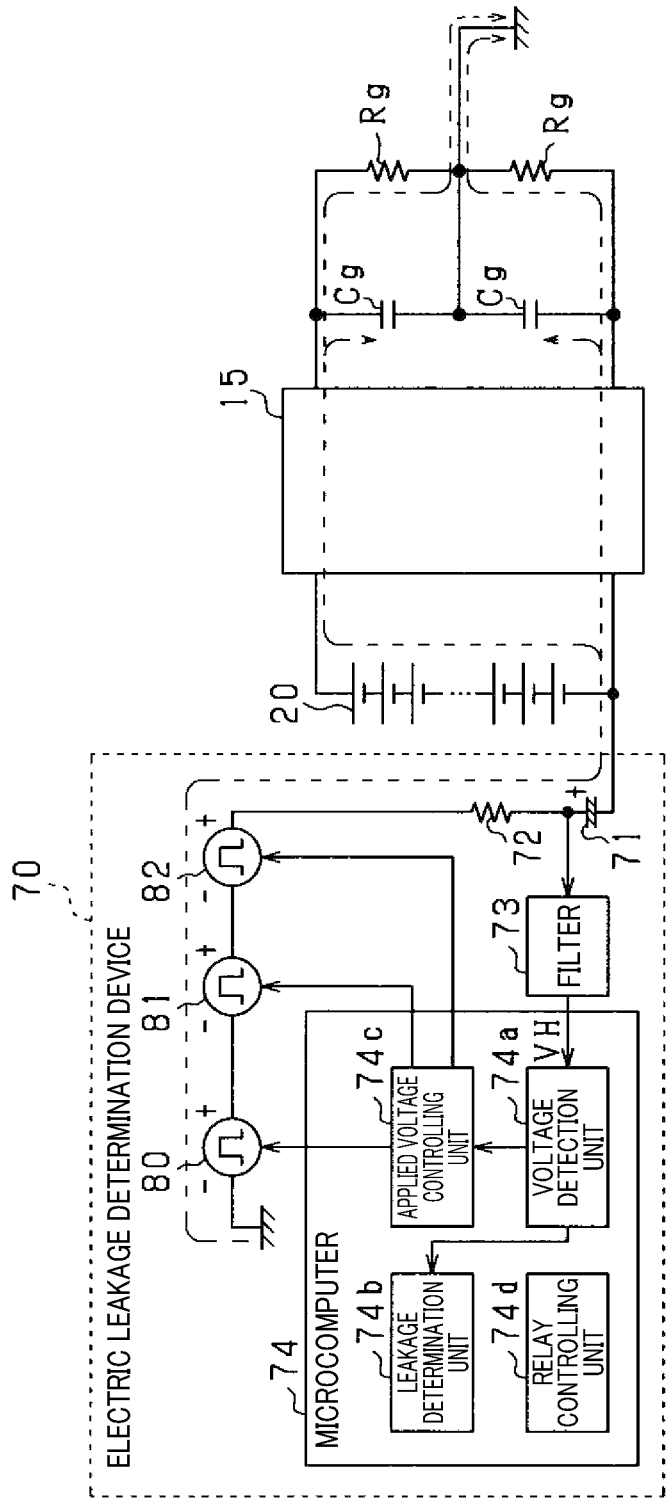
FIG. 3 is a diagram showing an electric current flow path when a combined voltage signal is supplied.

When the first pulse signal Sg1 shown in FIG. 2(b) is supplied to the negative electrode terminal side of the assembled battery 20, current flows as shown by the broken line in FIG. 3. Note that, in FIG. 3, components such as the first main relay 11 and the second main relay 12 are not shown. The reference number 15 in FIG. 3 indicates, of the electric devices constituting the power supply circuit 10, the electric device(s) that is (are) connected to a relay that is ON. For example, when, of the first main relay 11 and the second main relay 12, only the second main relay 12 is ON, the electric device 15 is the charger 60.

In a transitional state immediately after the output of the first pulse signal Sg1, currents flow through the common capacitances Cg as shown by the broken line in FIG. 3, but once charging of the common capacitances Cg is completed, no current flows through the common capacitances Cg. In this case, currents flow through the detection resistor 72 and the insulation resistors Rg, and the peak value of the detected voltage value VH detected by the voltage detection unit 74a will be an accurate value reflecting the insulation resistance Rg.

Since the common capacitance Cg changes depending on various factors, the amount of charge required to complete charging of the common capacitance Cg also changes. Therefore, in order for the peak value of the detected voltage value VH to be an accurate value that reflects the insulation resistance Rg, the first pulse width TP1 of the first pulse signal Sg1 and the second pulse width TP2 of the second pulse signal Sg2 need to have appropriate lengths. The present embodiment is configured to set appropriate lengths for the first pulse width TP1 and the second pulse width TP2. This configuration will be described with reference to FIGS. 4 to 7.

First, a case where the amount of charge of the common capacitance Cg is insufficient will be described with reference to FIG. 4. FIG. 4(a) shows a transition of the combined voltage signal Sgc, FIG. 4(b) shows a transition of a current IC flowing to the common capacitance Cg, and FIG. 4(c) shows a transition of the detected voltage value VH.

The main cause of a shortage of the charge amount of the common capacitance Cg is increases in the insulation resistance Rg and/or the common capacitance Cg. An increase in the insulation resistance Rg or the common capacitance Cg causes a time constant of when the detected voltage value VH changes to increase. As a result, the amount of charge of the common capacitance Cg will be insufficient when the first pulse width TP1 shown in FIG. 4(a) is used.

Specifically, the combined voltage signal Sgc has a second amplitude Vi2, which is a high amplitude, during the first pulse width TP1 from time t0 to time t1. In accordance with this, the detected voltage value VH increases from 0 to a first voltage value Vh1, which is the detected voltage value VH at time t1. Note that Ip in FIG. 4(b) indicates the peak value of the current IC flowing into the common capacitance Cg.

The combined voltage signal Sgc has a first amplitude Vi1, which is a low amplitude, from time t1 to time t2. Time t2 is the timing at which a time period of ½ of the drive cycle TS has elapsed from time t0. Since the charge amount of the common capacitance Cg is insufficient, the current IC flows into the common capacitance Cg during the period from time t1 to time t2 and the detected voltage value VH gradually increases. A second voltage value Vh2, which is the detected voltage value VH at time t2, indicates the peak value of the detected voltage value VH which is smaller than a true peak value VT indicated by the alternate long and short dash line in FIG. 4 (c). The true peak value VT is the second voltage value Vh2 of when the amount of charge of the common capacitance Cg is an appropriate value (for example, the full charge amount).

The combined voltage signal Sgc has a third amplitude Vi3, which is a high amplitude, during the second pulse width TP2 from time t2 to time t3. In the time period from t2 to t3, the current IC flows out from the common capacitance Cg, and the detected voltage value VH decreases from the second voltage value Vh2 to a third voltage value Vh3, which is the detected voltage value VH at time t3. In the example shown in FIG. 4, since the second pulse width TP2 is smaller than the appropriate pulse width, the charge accumulated in the common capacitance Cg cannot be discharged completely.

The combined voltage signal Sgc is zero from time t3 to time t4. In the time period from t3 to t4, the current IC flows out from the common capacitance Cg, and the detected voltage value VH decreases from the third voltage value Vh3 to a fourth voltage value Vh4, which is the detected voltage value VH at time t4.

In FIG. 4(c), the value obtained by subtracting the fourth voltage value Vh4 from the second voltage value Vh2 is referred to as a determination voltage ΔVJ, the value obtained by subtracting the first voltage value Vh1 from the second voltage value Vh2 is referred to as a first voltage deviation ΔV1, and the value obtained by subtracting the fourth voltage value Vh4 from the third voltage value Vh3 is referred to as a second voltage deviation ΔV2.

Since the common capacitance Cg and the insulation resistance Rg are connected in parallel in the equivalent circuit, when the charge amount of the common capacitance Cg is insufficient, the peak value of the detected voltage value VH becomes smaller than the true peak value VT. Therefore, in such a case, in the present embodiment, the charge amount of the common capacitance Cg is increased by increasing the first pulse width TP1. Further, discharge of the charge accumulated in the common capacitance Cg is optimized by setting the second pulse width TP2 according to the increased first pulse width TP1.

Figure 4:
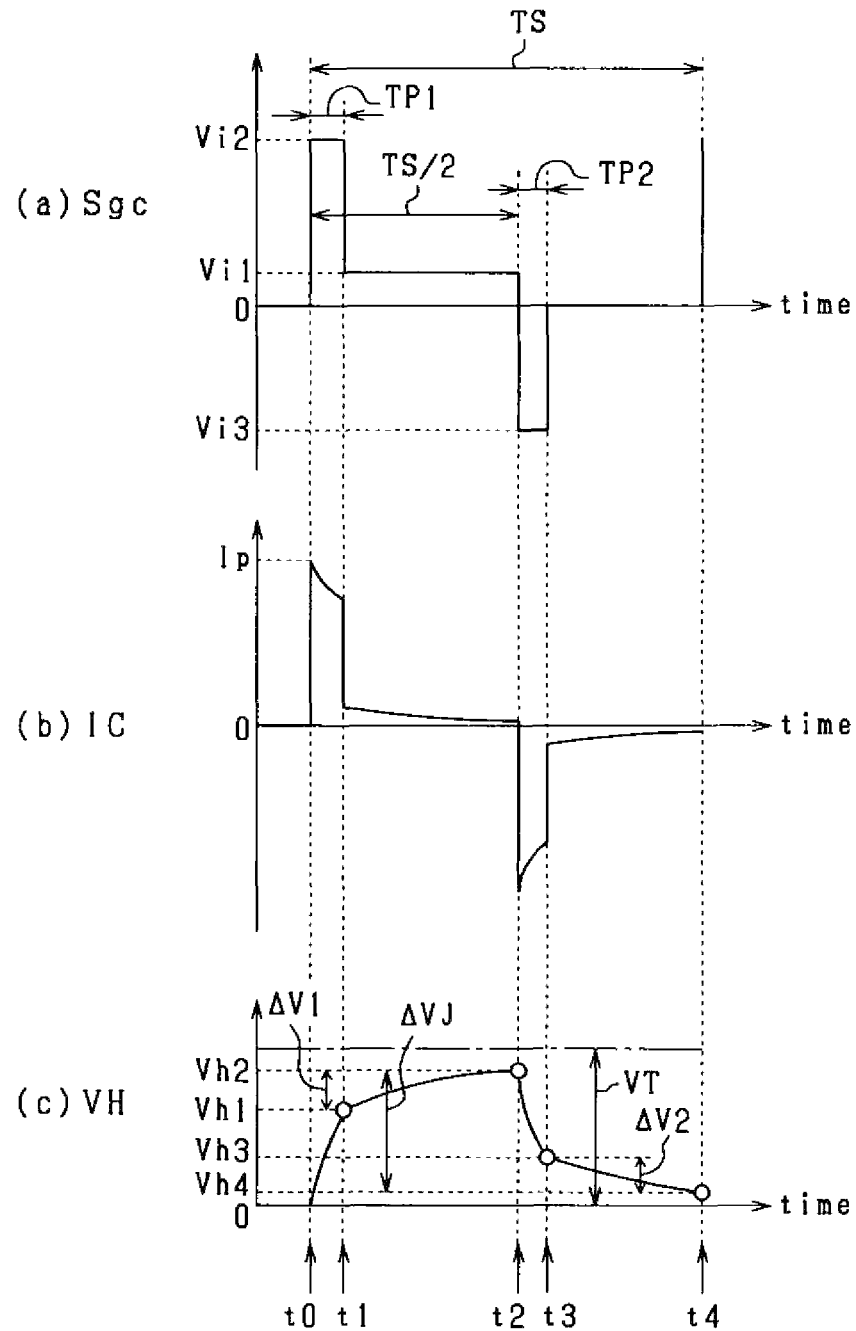
FIG. 4 is a diagram showing how a detected voltage value and other data change when the amount of charge of common capacitance is insufficient.
Figure 5:
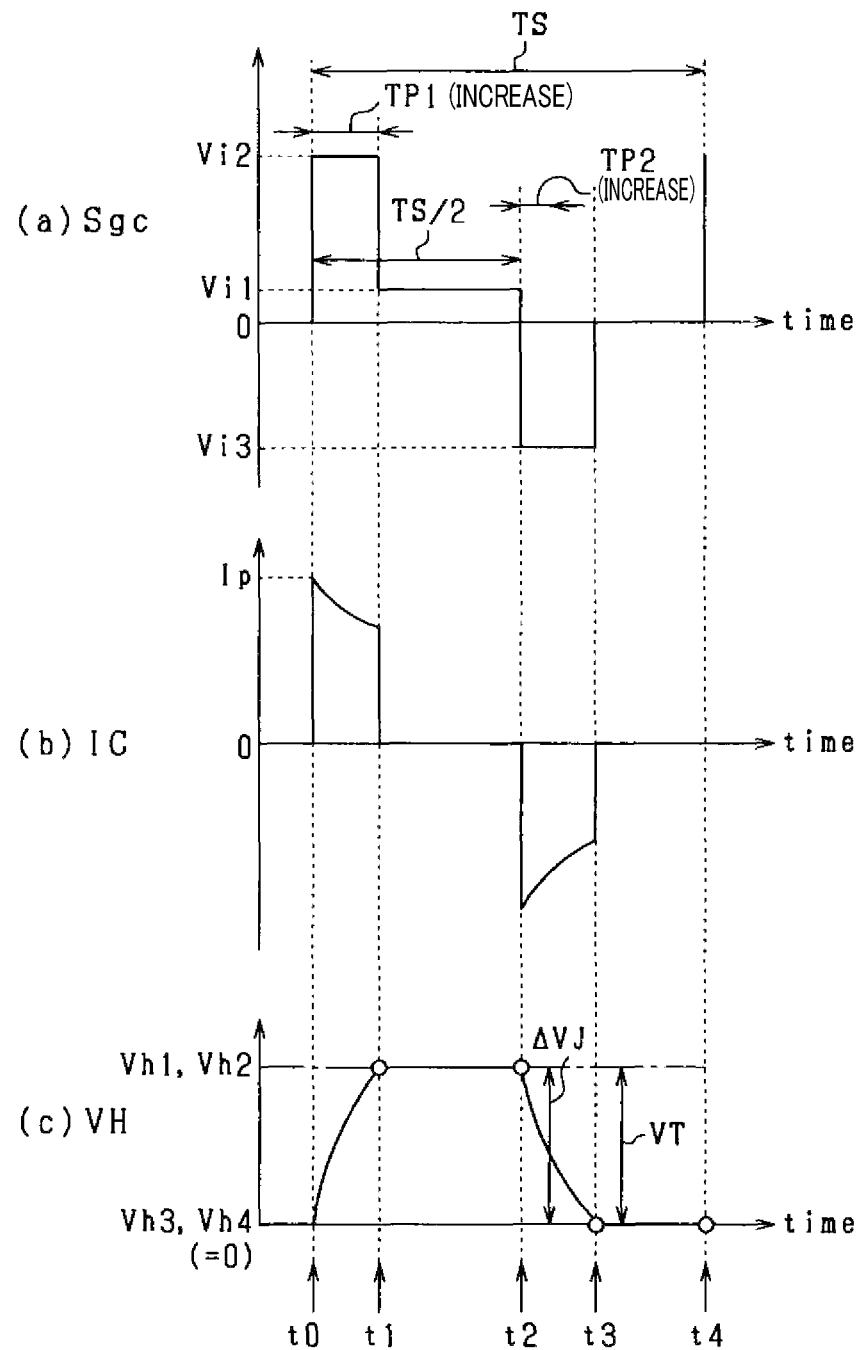
FIG. 5 is a diagram showing how the detected voltage value and other data change when the pulse width of a pulse signal is increased.

FIG. 5 shows a case where the first and second pulse widths TP1 and TP2 are increased from the pulse widths shown in FIG. 4. FIGS. 5(a) to 5(c) correspond to FIGS. 4(a) to 4(c) described above. Therefore, the time points t0 to t4, the voltage values Vh1 to Vh4, and the like in FIG. 5 also correspond to the time points t0 to t4, the voltage values Vh1 to Vh4, and the like in FIG. 4.

As shown in FIG. 5(a), due to the increase in the first pulse width TP1, the time period for which the drive signal Sgs is output decreases from that shown in FIG. 4(a), and the time period for which the combined voltage signal Sgc has the first amplitude Vi1 is reduced. By increasing the first pulse width TP1, when the common capacitance Cg is completely charged, the current IC flowing through the common capacitance Cg becomes 0 between time t1 and t2 as shown in FIG. 5(c), and the detected voltage value VH does not change from the true peak value VT. Therefore, if the determination voltage ΔVJ (=Vh2−Vh4) is calculated in this case, the true peak value VT can be detected with high accuracy. The determination voltage ΔVJ can also be calculated by "Vh1−Vh3".

Next, a case where the amount of charge of the common capacitance Cg is excessive will be described with reference to FIG. 6. FIGS. 6(a) to 6(c) correspond to FIGS. 4(a) to 4(c) described above.

The main cause of an excess of the charge amount of the common capacitance Cg is decrease in the insulation resistance Rg and/or the common capacitance Cg. A decrease in the insulation resistance Rg or the common capacitance Cg causes the time constant of when the detected voltage value VH changes to decrease. As a result, the amount of charge of the common capacitance Cg will be excessive when the first pulse width TP1 shown in FIG. 6(a) is used.

Specifically, the combined voltage signal Sgc has a second amplitude Vi2, which is a high amplitude, during the first pulse width TP1 from time t0 to time t1. In accordance with this, the detected voltage value VH increases from 0 to the first voltage value Vh1.

The combined voltage signal Sgc has a first amplitude Vi1, which is a low amplitude, from time t1 to time t2. Since the charge amount of the common capacitance Cg is excessive, the current IC flows out from the common capacitance Cg during the time period from time t1 to time t2 and the detected voltage value VH gradually decreases. The peak value of the detected voltage value VH at time t2 is larger than the true peak value VT indicated by the alternate long and short dash line.

The combined voltage signal Sgc has a third amplitude Vi3, which is a high amplitude, during the second pulse width TP2 from time t2 to time t3. In the time period from t2 to t3, the current IC flows out from the common capacitance Cg, and the detected voltage value VH decreases from the second voltage value Vh2 to the third voltage value Vh3. In the example shown in FIG. 6, the second pulse width TP2 is larger than the appropriate pulse width.

The combined voltage signal Sgc is zero from time t3 to time t4. In the time period from t3 to t4, the current IC flows into the common capacitance Cg, and the detected voltage value VH increases from the third voltage value Vh3 to the fourth voltage value Vh4.

When the charge amount of the common capacitance Cg is excessive, the peak value of the detected voltage value VH becomes larger than the true peak value VT. Therefore, in such a case, in the present embodiment, the charge amount of the common capacitance Cg is reduced by reducing the first pulse width TP1. Further, discharge of the charge accumulated in the common capacitance Cg is optimized by setting the second pulse width TP2 according to the reduced first pulse width TP1.

Figure 6:
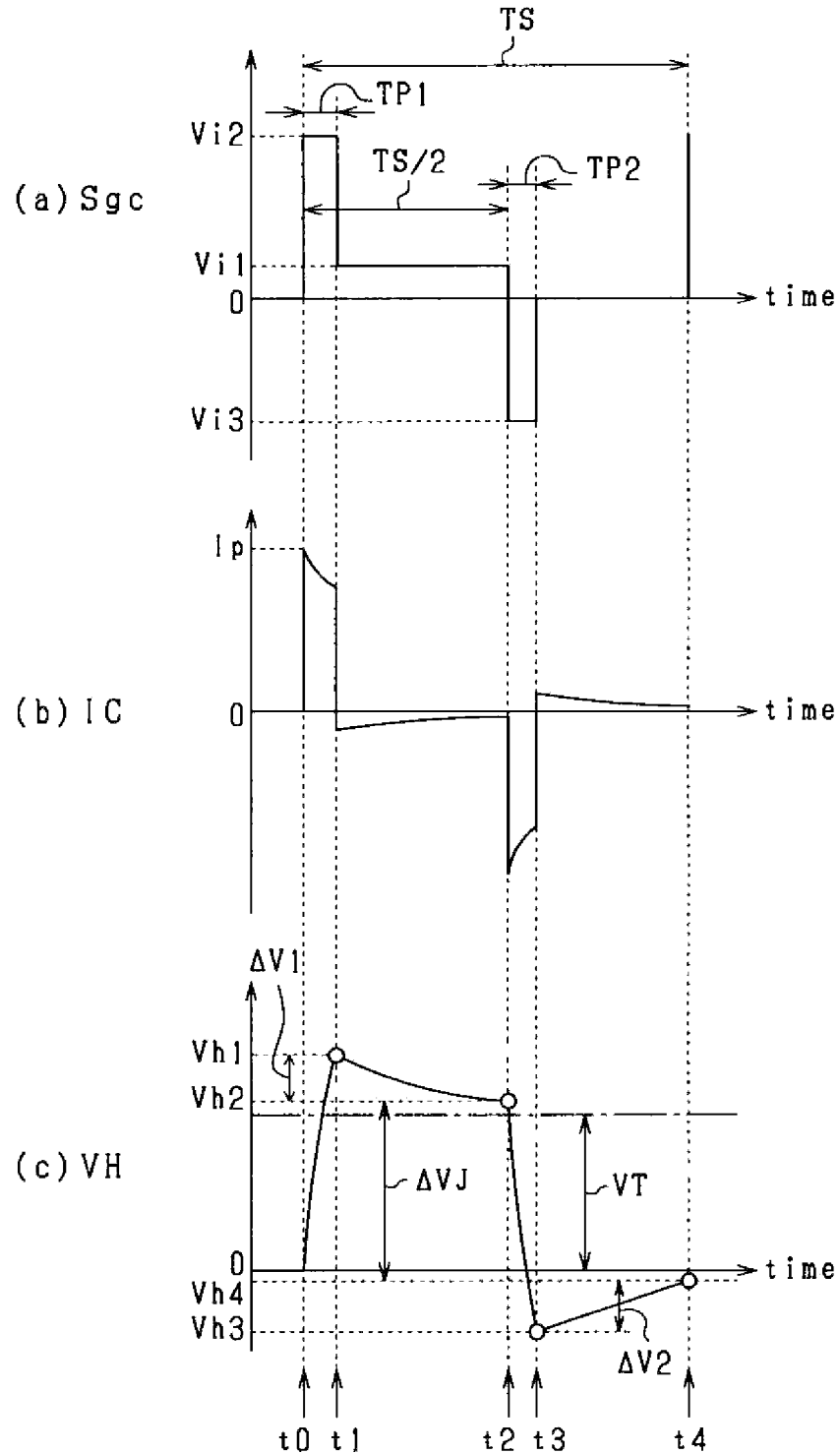
FIG. 6 is a diagram showing how the detected voltage value and other data change when the amount of charge of the common capacitance is excessive.
Figure 7:
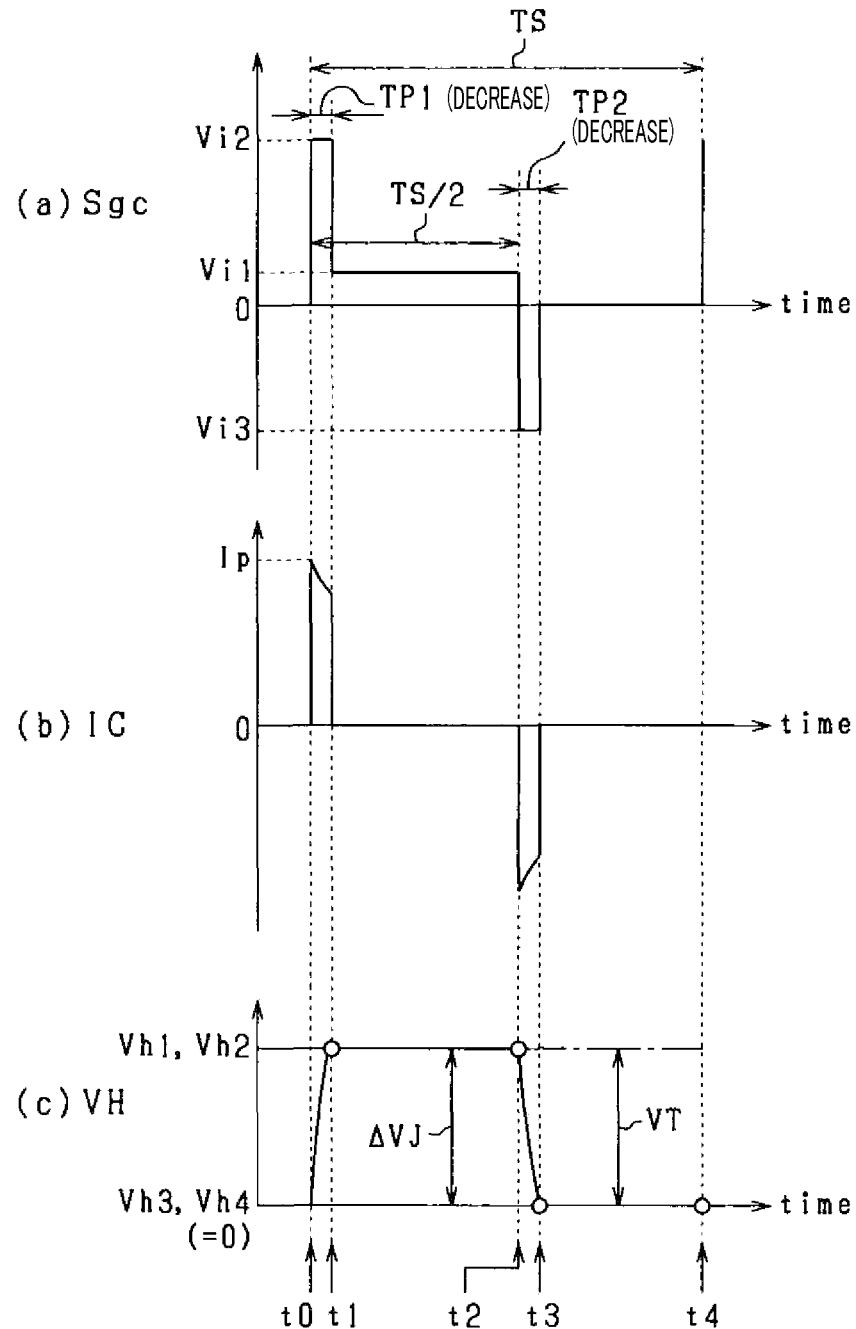
FIG. 7 is a diagram showing how the detected voltage value and other data change when the pulse width of the pulse signal is reduced.

FIG. 7 shows a case where the first and second pulse widths TP1 and TP2 are reduced from the pulse widths shown in FIG. 6. FIGS. 7(a) to 7(c) correspond to FIGS. 6(a) to 6(c) described above.

As shown in FIG. 7(a), due to the decrease in the first pulse width TP1, the time period for which the drive signal Sgs is output increases from that shown in FIG. 6(a), and the time period for which the combined voltage signal Sgc has the first amplitude Vi1 increases. By reducing the first pulse width TP1, when the common capacitance Cg is completely charged, the current IC flowing through the common capacitance Cg becomes 0 between time t1 and t2 as shown in FIG. 7(c), and the detected voltage value VH does not change from the true peak value VT. Therefore, if the determination voltage ΔVJ (=Vh2−Vh4) is calculated in this case, the true peak value VT can be detected with high accuracy.

Figure 8:
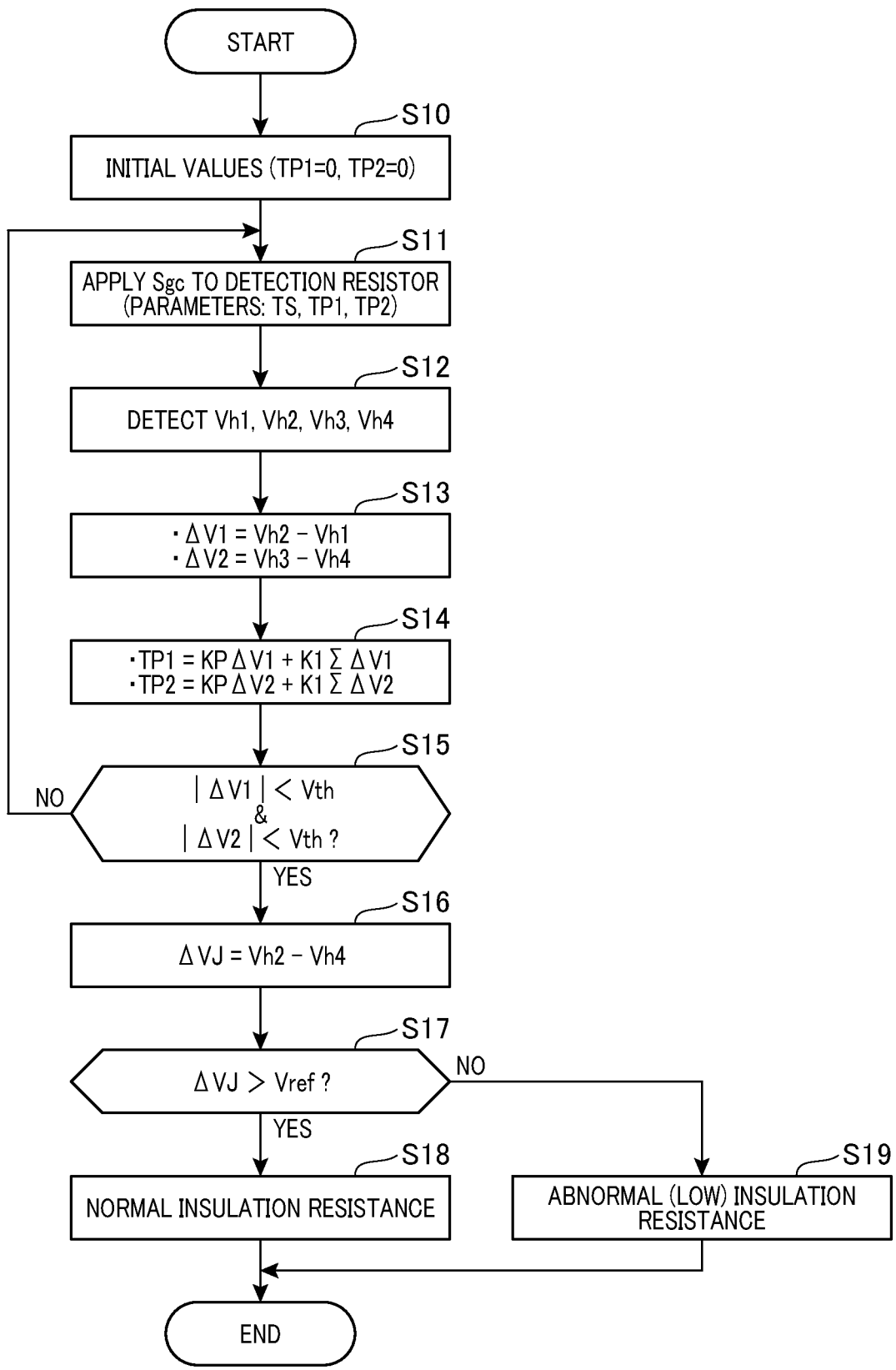
FIG. 8 is a flowchart showing a procedure of an electrical leakage determination process.

FIG. 8 shows procedures of an electrical leakage determination processing performed by the microcomputer 74.

In step S10, the first pulse width TP1 and the second pulse width TP2 are set to their initial values. The initial values may be set to 0, or values larger than 0 in anticipation that the common capacitance Cg is charged in advance.

In step S11, the combined voltage signal Sgc generated by the generation units 80 to 82 is applied to the detection resistor 72.

In step S12, the first to fourth voltage values Vh1 to Vh4 are detected. As described above, the first voltage value Vh1 is the detected voltage value VH at the timing at which output of the drive signal Sgs is started, and the second voltage value Vh2 is the detected voltage value VH at the timing at which output of the drive signal Sgs is stopped. The third voltage value Vh3 is the detected voltage value VH at the timing at which output of the second pulse signal Sg2 is stopped, and the fourth voltage value Vh4 is the detected voltage value VH at the timing at which the drive cycle TS has passed from the start of the output of the first pulse signal Sg1.

In step S13, the first voltage deviation ΔV1 is calculated by subtracting the first voltage value Vh1 from the second voltage value Vh2. In addition, the second voltage deviation ΔV2 is calculated by subtracting the fourth voltage value Vh4 from the third voltage value Vh3.

In step S14, the first pulse width TP1 is calculated based on the first voltage deviation ΔV1. In principle, when the first voltage deviation ΔV1 is zero, the first pulse width TP1 of the ongoing processing cycle is maintained at the first pulse width TP1 of the previous processing cycle. On the other hand, when the first voltage deviation ΔV1 is positive, the first pulse width TP1 is increased, and when the first voltage deviation ΔV1 is negative, the first pulse width TP1 is reduced.

In the present embodiment, the first pulse width TP1 is calculated as a manipulated variable for feedback-controlling the first voltage deviation ΔV1 to zero. In the present embodiment, proportional integral control is employed as the feedback control. Therefore, in step S14, a value obtained by multiplying the first voltage deviation ΔV1 by a proportional gain KP is added to a value obtained by multiplying the time integral value of the first voltage deviation ΔV1 by an integral gain KI to calculate the first pulse width TP1. Note that the proportional gain KP and the integral gain KI may be set in consideration of responsiveness and stability based on the general control design theory.

In addition, in step S14, the second pulse width TP2 is calculated based on the second voltage deviation ΔV2. In principle, when the second voltage deviation ΔV2 is zero, the second pulse width TP2 of the ongoing processing cycle is maintained at the second pulse width TP2 of the previous processing cycle. On the other hand, when the second voltage deviation ΔV2 is positive, the second pulse width TP2 is increased, and when the second voltage deviation ΔV2 is negative, the second pulse width TP2 is reduced.

In the present embodiment, the second pulse width TP2 is calculated as a manipulated variable for feedback-controlling the second voltage deviation ΔV2 to zero. In the present embodiment, proportional integral control is employed as the feedback control. Therefore, a value obtained by multiplying the second voltage deviation ΔV2 by the proportional gain KP is added to a value obtained by multiplying the time integral value of the second voltage deviation ΔV2 by the integral gain KI to calculate the second pulse width TP2.

The time integral values of the first and second pulse signals Sg1, Sg2 increase by increasing the first and second pulse widths TP1, TP2.

In step S15, it is determined whether a first condition that the absolute value of the first voltage deviation ΔV1 calculated in step S13 is less than a threshold Vth and a second condition that the absolute value of the second voltage deviation ΔV2 calculated in step S13 is less than the threshold Vth are both satisfied. The processing of step S15 is for determining whether the voltage deviations ΔV1, ΔV2 have converged to zero. The threshold Vth may be set to, for example, a value in the vicinity of zero.

When it is determined in step S15 that only one of the first and second conditions is satisfied or neither of the first and second conditions is satisfied, the process proceeds to step S11.

The processing of steps S11, S14, and S15 may be performed by the applied voltage control unit 74c (corresponding to a "variable control unit"), and the processing of step S12 may be performed by the voltage detection unit 74a.

On the other hand, when it is determined in step S15 that both of the first and second conditions are satisfied, the process proceeds to step S16, and the determination voltage ΔVJ is calculated by subtracting the fourth voltage value Vh4 from the second voltage value Vh2. Then, it is determined whether the calculated determination voltage ΔVJ exceeds an abnormality determination threshold Vref.

When it is determined in step S17 that the determination voltage ΔVJ exceeds the abnormality determination threshold Vref, the process proceeds to step S18 and it is determined that the insulation resistance Rg has a normal value. That is, it is determined that there is no electrical leakage.

On the other hand, when it is determined in step S17 that the determination voltage ΔVJ is equal to or less than the abnormality determination threshold Vref, the process proceeds to step S19 and it is determined that the insulation resistance Rg is abnormally low. That is, it is determined that there is electrical leakage. Then, an abnormality signal indicating that electrical leakage has occurred is output to the outside. The processing of steps S16 to S19 may be performed by the electrical leakage determination unit 74b.

According to the present embodiment described above in detail, whether there is electrical leakage between the power supply circuit 10 and the vehicle body can be correctly determined even if the common capacitance Cg between the power supply circuit 10 and the vehicle body changes due to various factors.

Variation of First Embodiment

In FIG. 1 described above, the first end of the capacitor 71 may be connected to the positive terminal of the assembled battery 20 instead of the negative terminal of the assembled battery 20.

Second Embodiment

Figure 9:
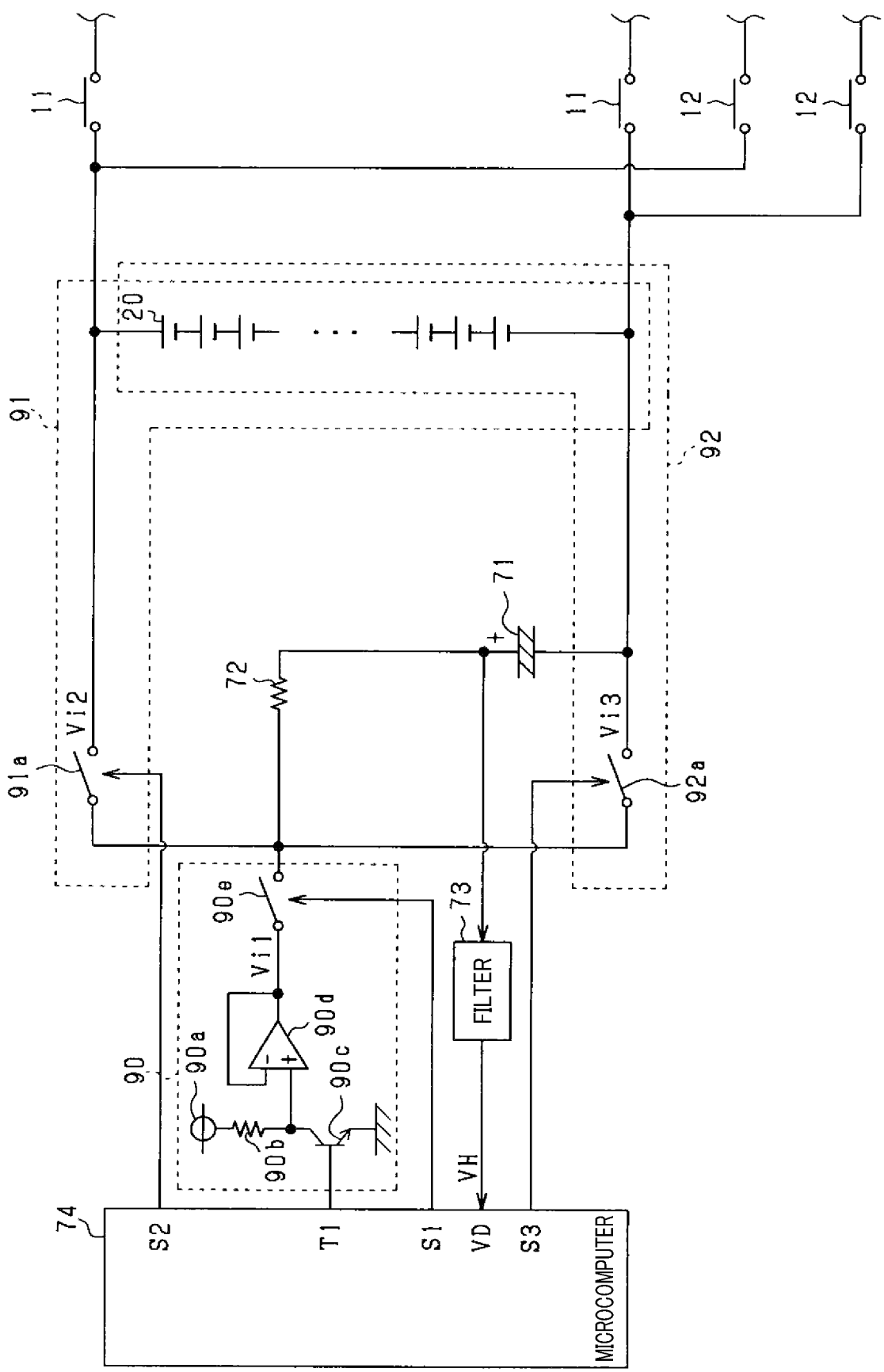
FIG. 9 is a diagram showing an electrical leakage determination device according to a second embodiment.

The second embodiment will now be described with reference to the drawings, focusing on its differences from the first embodiment. In the present embodiment, as shown in FIG. 9, the configuration of the generation units of the combined voltage signal Sgc is changed. In FIG. 9, for the sake of convenience, components that are the same as or correspond to the components shown in FIG. 1 described above are denoted by the same reference numbers. FIG. 9 mainly shows the configuration of the electrical leakage determination device.

The electrical leakage determination device includes a drive signal generation unit 90, and first and second pulse generation units 91, 92.

The drive signal generation unit 90 includes a voltage follower circuit and a first switch 90e. The voltage follower circuit includes a constant voltage power supply 90a, a resistor 90b, a switch 90c, and an operational amplifier 90d. In the present embodiment, the switch 90c is an NPN bipolar transistor.

The collector of the switch 90c is connected to the constant voltage power supply 90a via the resistor 90b. The emitter of the switch 90c is connected to the vehicle body as the ground. A non-inverting input terminal of the operational amplifier 90d is connected to the connection point between the resistor 90b and the switch 90c, and an output terminal of the operational amplifier 90d is connected to an inverting input terminal of the operational amplifier 90d. The second end of the detection resistor 72 is connected to the output terminal of the operational amplifier 90d via the first switch 90e.

An applied voltage control unit (not shown) included in the microcomputer 74 controls output voltage of the voltage follower circuit to the first amplitude Vi1 by turning on or off the switch 90c via the terminal T1 of the microcomputer 74. The applied voltage control unit turns on or off the first switch 90e via the terminal S1 of the microcomputer 74.

The first pulse generation unit 91 includes the assembled battery 20 and a second switch 91a (corresponding to a "first switch") that connects the positive electrode side of the assembled battery 20 and the second end of the detection resistor 72. The applied voltage control unit turns on or off the second switch 91a via the terminal S2 of the microcomputer 74.

The second pulse generation unit 92 includes the assembled battery 20 and a third switch 92a (corresponding to a "second switch") that connects the negative electrode side of the assembled battery 20 and the second end of the detection resistor 72. The applied voltage control unit turns on or off the third switch 92a via the terminal S3 of the microcomputer 74. Note that the detected voltage value VH is input to the voltage detection unit 74a (not shown) included in the microcomputer 74 via a terminal VD of the microcomputer 74.

The electrical leakage determination process according to the present embodiment will be described with reference to FIG. 10. FIGS. 10(a) to 10(d) show transitions of driving states of the switch 90c, the first switch 90e, the second switch 91a, and the third switch 92a, and FIG. 10(e) shows a transition of the combined voltage signal Sgc.

In the present embodiment, the second amplitude Vi2 is applied to the detection resistor 72 by turning on the second switch 91a during the first pulse width TP1.

Further, when the switch 90c is turned off and the first switch 90e is turned on for the time period of "TS/2−TP1", the first amplitude Vi1 is applied to the detection resistor 72. In the present embodiment, the switch 90c is OFF during the period from the timing at which the second switch 91a is turned on to the timing at which the first switch 90e is turned off.

The third amplitude Vi3 is applied to the detection resistor 72 by turning on the third switch 92a during the second pulse width TP2, and the voltage applied to the detection resistor 72 becomes zero by turning off the switches 90e, 91a, 92a for the time period of "TS/2-TP2".

A process similar to that shown in FIG. 8 can also be performed in the present embodiment. Specifically, when the combined voltage signal Sgc has the first amplitude Vi1, the ON period of the second switch 91a is increased when the first voltage deviation ΔV1 increases, and the ON period of the second switch 91a is decreased when the first voltage deviation ΔV1 decreases. On the other hand, when the combined voltage signal Sgc is zero, the ON period of the third switch 92a is increased when the second voltage deviation ΔV2 increases, and the ON period of the third switch 92a is decreased when the second voltage deviation ΔV2 decreases.

Further, in the present embodiment, the second and third amplitudes Vi2, Vi3, which are high amplitudes, may fluctuate depending on the potential of the vehicle body. Even in this case, the pulse widths TP1, TP2 can be set to appropriate lengths by the process shown in FIG. 8 that can optimize the charge amount of the common capacitance Cg. This makes it possible to prevent the electrical leakage determination accuracy from decreasing even when the second and third amplitudes Vi2, Vi3 fluctuate.

According to the present embodiment described above, a combined voltage signal Sgc similar to that of the first embodiment can be applied to the detection resistor 72.

Further, according to the present embodiment, the high second and third amplitudes Vi2, Vi3 can be applied to the detection resistor 72 by using the assembled battery 20. Therefore, there is no need to provide a new power supply circuit for generating the second and third amplitudes Vi2, Vi3. Thus, the number of parts of the electrical leakage determination device can be reduced, which in turn reduces the cost of the electrical leakage determination device.

Third Embodiment

Figure 11:
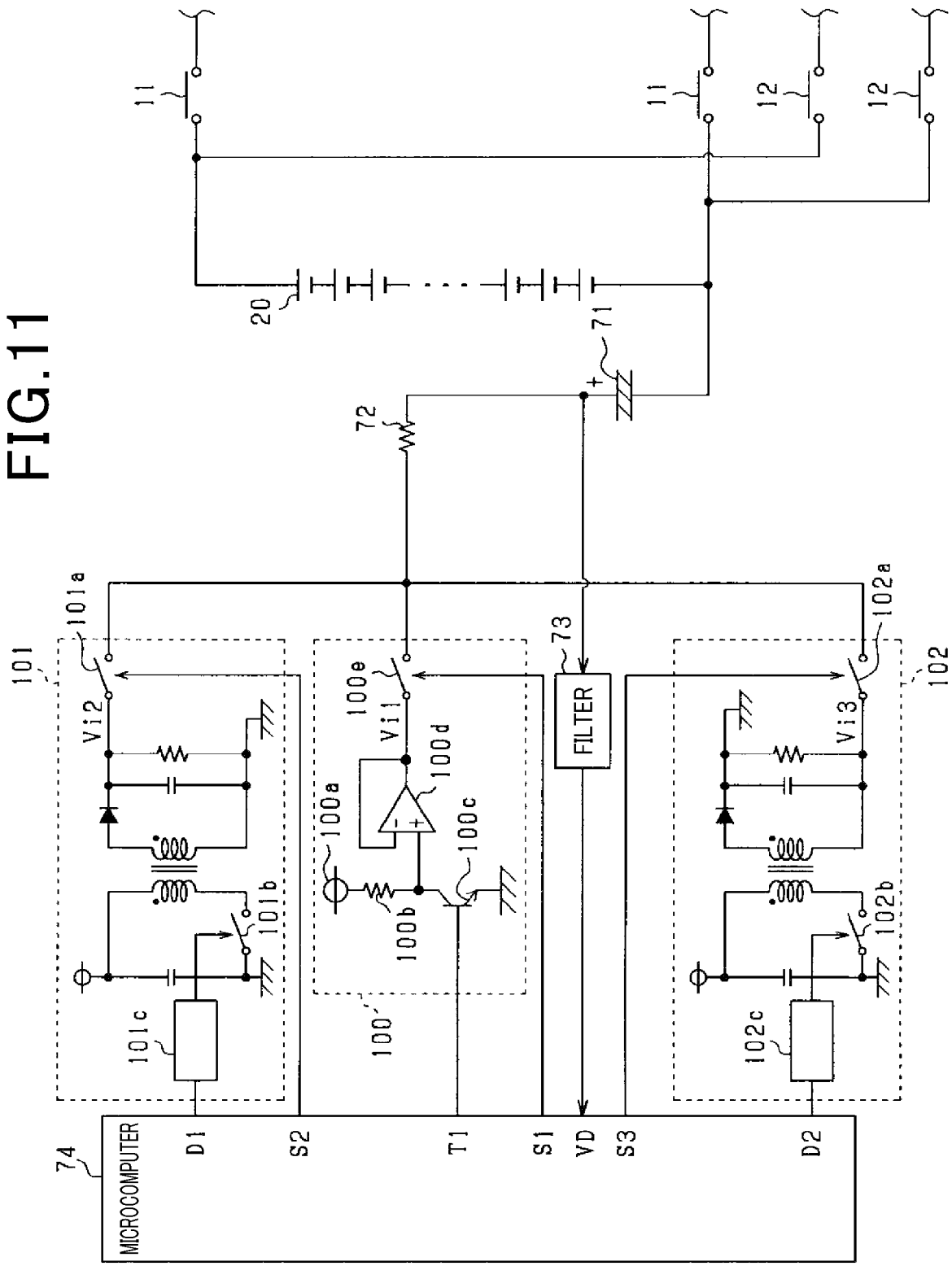
FIG. 11 is a diagram showing an electrical leakage determination device according to a third embodiment.

The third embodiment will now be described with reference to the drawings, focusing on its differences from the first embodiment. In the present embodiment, the charge amount of the common capacitance Cg is set to an appropriate value by variably setting the second and third amplitudes Vi2, Vi3 instead of the first and second pulse widths TP1, TP2. Therefore, as shown in FIG. 11, the configuration of the generation units of the combined voltage signal Sgc is changed. In FIG. 11, for the sake of convenience, components that are the same as or correspond to the components shown in FIGS. 1 and 9 described above are denoted by the same reference numbers. FIG. 11 mainly shows the configuration of the electrical leakage determination device.

The electrical leakage determination device includes a drive signal generation unit 100, and first and second pulse generation units 101, 102.

The drive signal generation unit 100 includes a voltage follower circuit and a first switch 100e. As with the second embodiment, the voltage follower circuit includes a constant voltage power supply 100a, a resistor 100b, a switch 100c, and an operational amplifier 100d. The second end of the detection resistor 72 is connected to an output terminal of the operational amplifier 100d via the first switch 100e. An applied voltage control unit (not shown) included in the microcomputer 74 controls output voltage of the voltage follower circuit to the first amplitude Vi1 by turning on or off the switch 100c via the terminal T1 of the microcomputer 74. The applied voltage control unit turns on or off the first switch 100e via the terminal S1 of the microcomputer 74.

The first pulse generation unit 101 includes a DC/DC converter and a second switch 101a. The DC/DC converter of the present embodiment is an isolated flyback converter configured so that the second amplitude Vi2, which is output voltage, is positive with respect to the potential of the vehicle body. The DC/DC converter includes a first driving switch 101b and a first driver 101c, and has a function of boosting and outputting input voltage (for example, 5V). The boost ratio of the DC/DC converter can be adjusted by adjusting a first duty ratio Duty1 (=Ton1/Tsw), which is a ratio of an ON period Ton1 of the first driving switch 101b to a specified period Tsw. The applied voltage control unit adjusts the first duty ratio Duty1 via a D1 terminal of the microcomputer 74 and the first driver 101c. The applied voltage control unit also turns on or off the second switch 101a via the terminal S2 of the microcomputer 74. Since the configuration of the DC/DC converter is a well-known technique, detailed description thereof will be omitted.

The second pulse generation unit 102 includes a DC/DC converter and a third switch 102a. The DC/DC converter of the present embodiment is an isolated flyback converter configured so that the third amplitude Vi3, which is output voltage, is negative with respect to the potential of the vehicle body. The DC/DC converter includes a second driving switch 102b and a second driver 102c, and has a function of boosting and outputting input voltage (for example, 5V). The boost ratio of the DC/DC converter can be adjusted by adjusting a second duty ratio Duty2 (=Ton2/Tsw), which is a ratio of an ON period Ton2 of the second driving switch 102b to the specified period Tsw. The applied voltage control unit adjusts the second duty ratio Duty2 via a D2 terminal of the microcomputer 74 and the second driver 102c. The applied voltage control unit also turns on or off the third switch 102a via the terminal S3 of the microcomputer 74.

Note that the DC/DC converter is not limited to an isolated flyback converter as long as output voltage can be adjusted. In addition, signals of the first and second duty ratios Duty1, Duty2 from the microcomputer 74 may either be analog values or digital values.

Figure 12:
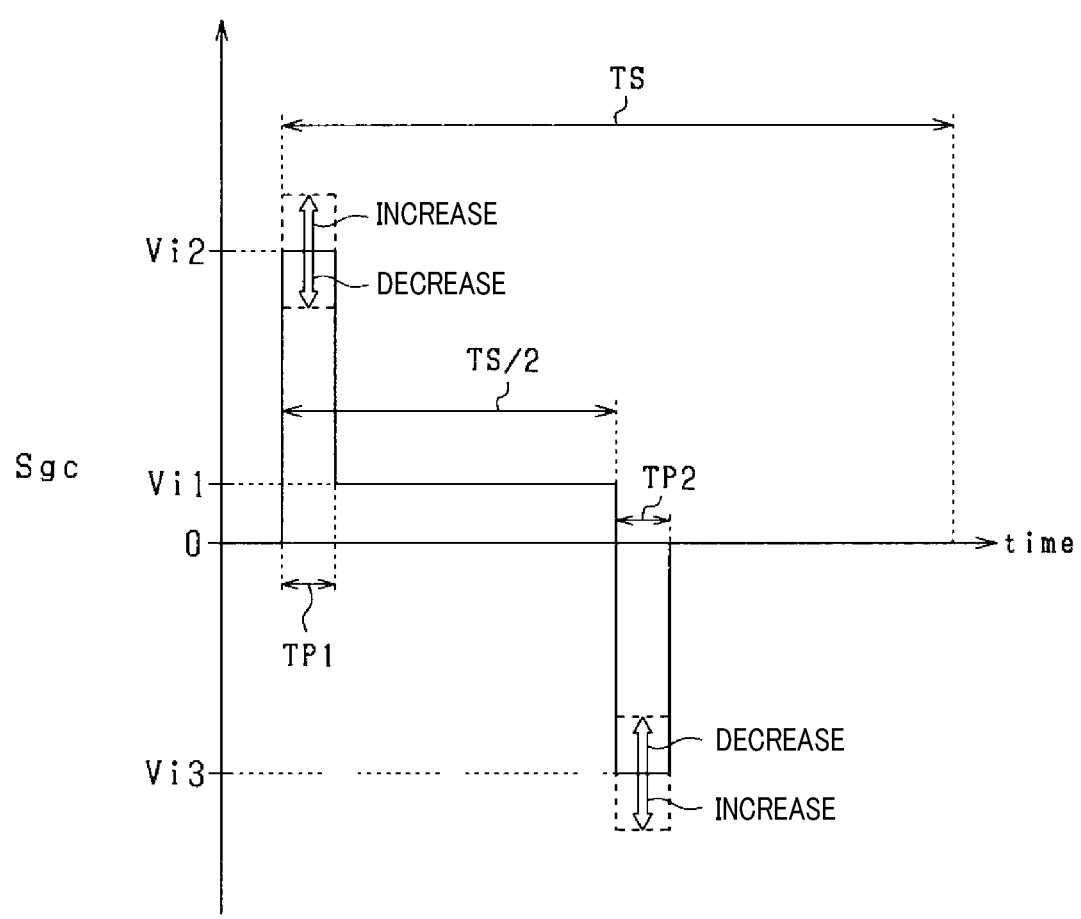
FIG. 12 is a diagram showing a combined voltage signal.

Next, the combined voltage signal Sgc generated by the drive signal generation unit 100, the first pulse generation unit 101, and the second pulse generation unit 102 will be described with reference to FIG. 12. In the present embodiment, the first pulse width TP1 and the second pulse width TP2 are fixed values, and the second amplitude Vi2 and the third amplitude Vi3 are variably set. Specifically, the second amplitude Vi2 increases as the first duty ratio Duty1 increases, and the third amplitude Vi3 increases as the second duty ratio Duty2 increases.

Figure 10:
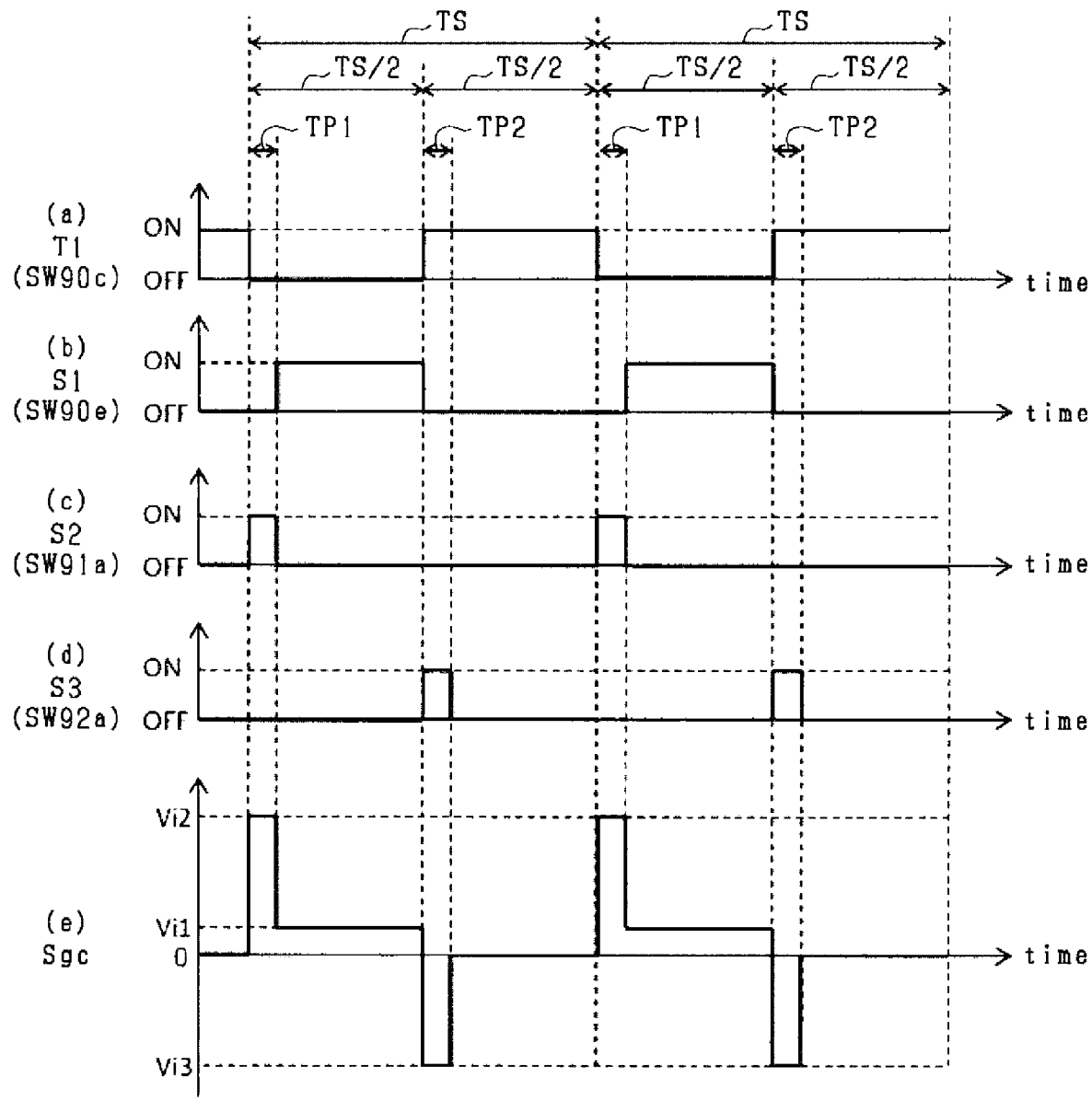
FIG. 10 is a time chart showing how the driving state of each switch of the electrical leakage electric device changes.

Note that, in the present embodiment, the switch 100c, the first switch 100e, the second switch 101a, and the third switch 102a may be driven in the same manner as the switch 90c, the first switch 90e, the second switch 91a, and the third switch 92a as shown in FIG. 10 described earlier.

Figure 13:
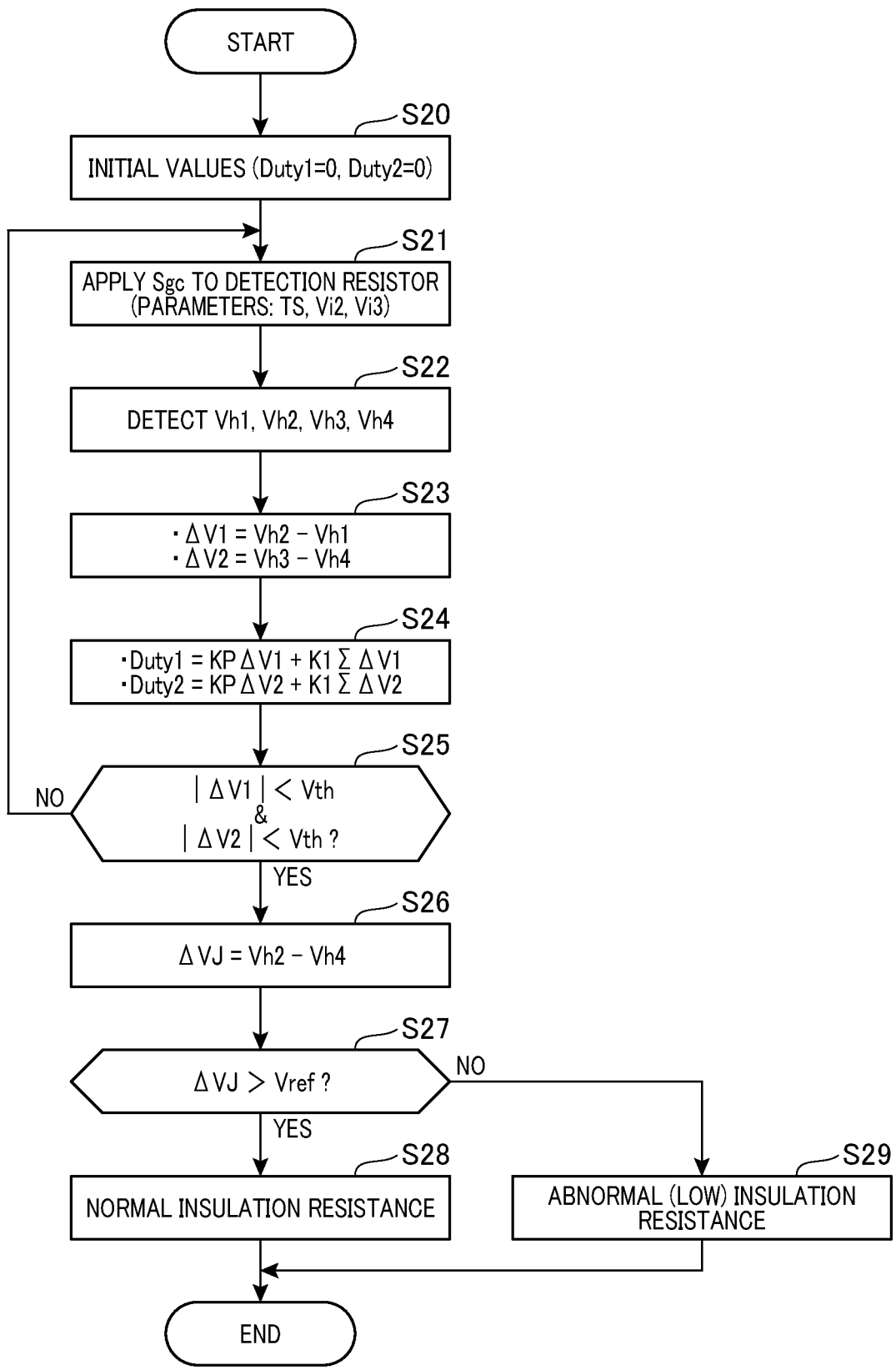
FIG. 13 is a flowchart showing a procedure of an electrical leakage determination process.

Next, FIG. 13 shows procedures of an electrical leakage determination processing performed by the microcomputer 74.

In step S20, the first duty ratio Duty1 and the second duty ratio Duty2 are set to their initial values. The initial values may be set to 0, or values larger than 0 in anticipation that the common capacitance Cg is charged in advance.

In step S21, the combined voltage signal Sgc generated by the generation units 100 to 102 is applied to the detection resistor 72.

In steps S22 and S23, procedures similar to those of steps S12 and S13 shown in FIG. 8 described above are performed.

In step S24, the first duty ratio Duty1 is calculated as a manipulated variable for feedback-controlling the first voltage deviation $\Delta V1$ to zero. In the present embodiment, proportional integral control is employed as the feedback control. Therefore, in step S24, a value obtained by multiplying the first voltage deviation $\Delta V1$ by the proportional gain KP is added to a value obtained by multiplying the time integral value of the first voltage deviation $\Delta V1$ by the integral gain KI to calculate the first duty ratio Duty1.

Further, in step S24, the second duty ratio Duty2 is calculated as a manipulated variable for feedback-controlling the second voltage deviation $\Delta V2$ to zero. In the present embodiment, proportional integral control is employed as the feedback control. Therefore, a value obtained by multiplying the second voltage deviation $\Delta V2$ by the proportional gain KP is added to a value obtained by multiplying the time integral value of the second voltage deviation $\Delta V2$ by the integral gain KI to calculate the second duty ratio Duty2.

In steps S25 to S29, procedures similar to those of steps S15 to S19 shown in FIG. 8 described earlier are performed.

According to the present embodiment described above, effects similar to those of the first embodiment can be obtained.

Variation of Third Embodiment

In FIG. 11 described earlier, the first end of the capacitor 71 may be connected to the positive terminal of the assembled battery 20 instead of the negative terminal of the assembled battery 20.

Other Embodiments

The above embodiments may be modified as below.

In the above embodiments, the microcomputer 74 may be configured to determine that there is electrical leakage when it is determined that the determination voltage $\Delta VJ$ has been equal to or less than the abnormality determination threshold Vref in more than one consecutive processing cycles.

The power supply systems to which the present disclosure is applied are not limited to power supply systems for vehicles. The batteries in the power supply system are not limited to assembled batteries.

The control units such as the microcomputer and their methods described herein may be achieved by a dedicated computer provided by configuring a processor and a memory programmed to execute one or more functions embodied by computer programs. Alternatively, the control units and their methods described herein may be achieved by a dedicated computer provided by configuring a processor with one or more dedicated hardware logic circuits. Alternatively, the control units and their methods described herein may be achieved by one or more dedicated computers configured by combining a processor and a memory programmed to execute one or more functions with a processor configured by one or more hardware logic circuits. Further, the computer program may be stored in a computer-readable non-transitional tangible recording medium as instructions executed by the computer.

Although the present disclosure is described based on examples, it should be understood that the present disclosure is not limited to the described examples and structures. The present disclosure encompasses various modifications and variations within the scope of equivalence. In addition, the scope and the spirit of the present disclosure encompass various combinations and forms and other combinations and forms including only one element, one or more elements, or one or less elements added thereto.

The present disclosure provides an electrical leakage determination device (70) configured to be applied to a power supply system including a battery (20) and an electric device (30, 40, 50, 60) that performs power transfer with the battery, a power supply circuit (10) including the battery and the electric device being electrically insulated from ground, the electrical leakage determination device comprising:

a capacitor (71) whose first end is connected to a positive electrode or a negative electrode of the battery;

a detection resistor (72) connected to a second end of the capacitor;

a detection unit (74a) for detecting a voltage value at a connection point between the detection resistor and the capacitor;

a low amplitude voltage application unit (80, 90, 100) for applying a low amplitude voltage (Sgs) having a first amplitude (Vi1) to the detection resistor every driving cycle (TS);

a high amplitude voltage application unit (81, 91, 101) for applying, before the application of the low amplitude voltage to the detection resistor, a high amplitude voltage (Sg1) having a second amplitude (Vi2) higher than the first amplitude and having the same polarity as the low amplitude voltage to the detection resistor for a time period that is shorter than ½ of the driving cycle;

a determination unit (74b) for determining whether there is electrical leakage between the power supply circuit and the ground based on a peak value ($\Delta VJ$) of the voltage value detected by the detection unit when the low amplitude voltage is being applied; and a variable control unit (74c) for changing a time integral value of the high amplitude voltage applied to the detection resistor based on a change in the voltage value detected by the detection unit when the low amplitude voltage is being applied.

The low amplitude voltage application unit of this disclosure applies a low amplitude voltage having a first amplitude to the detection resistor every driving cycle. The determination unit determines whether there is electrical leakage between the power supply circuit and the ground based on a peak value of the voltage value detected by the detection unit when the low amplitude voltage is being applied.

The reason why the accuracy in determining whether there is electrical leakage decreases as in the electrical leakage determination device described in JP 2016-128753 A is because the application of the low voltage amplitude is stopped before the charge amount of common capacitance converges, that is, before the common capacitance is completely charged. Therefore, before applying the low amplitude voltage to the power supply circuit, a high amplitude voltage having a second amplitude higher than the first amplitude and having the same polarity as the low amplitude voltage is applied to the detection resistor for a time period that is shorter than ½ of the driving cycle in order to rapidly charge the common capacitance.

However, when a high amplitude voltage is applied, the charge amount may become insufficient or excessive with respect to the optimum charge amount. Changes in the voltage value detected by the detection unit when a low amplitude voltage is being applied provide information for determining whether the charge amount of the common capacitance is insufficient or excessive with respect to the optimum charge amount.

In view of this, the variable control unit of the present disclosure changes a time integral value of the high amplitude voltage applied to the detection resistor based on a change in the voltage value detected by the detection unit when the low amplitude voltage is being applied. According to the configuration, whether there is electrical leakage between the power supply circuit and the ground can be correctly determined even if the common capacitance changes.

What is claimed is:

1. An electrical leakage determination device configured to be applied to a power supply system including a battery and an electric device that performs power transfer with the battery, a power supply circuit including the battery and the electric device being electrically insulated from ground, the electrical leakage determination device comprising:
    a capacitor whose first end is connected to a positive electrode or a negative electrode of the battery;
    a detection resistor connected to a second end of the capacitor;
    a detection unit for detecting a voltage value at a connection point between the detection resistor and the capacitor;
    a low amplitude voltage application unit for applying a low amplitude voltage having a first amplitude to the detection resistor every driving cycle;
    a high amplitude voltage application unit for applying, before the application of the low amplitude voltage to the detection resistor, a high amplitude voltage having a second amplitude higher than the first amplitude and having the same polarity as the low amplitude voltage to the detection resistor for a time period that is shorter than ½ of the driving cycle;
    a determination unit for determining whether there is electrical leakage between the power supply circuit and the ground based on a peak value of the voltage value detected by the detection unit when the low amplitude voltage is being applied; and
    a variable control unit for changing a time integral value of the high amplitude voltage applied to the detection resistor based on a change in the voltage value detected by the detection unit when the low amplitude voltage is being applied.

2. The electrical leakage determination device according to claim 1, wherein
    the high amplitude voltage application unit is a first high amplitude voltage application unit,
    the high amplitude voltage is a first high amplitude voltage,
    the electrical leakage determination device further comprises a second high amplitude voltage application unit for applying, when the application of the low amplitude voltage is stopped, a second high amplitude voltage having a third amplitude higher than the amplitude of the low amplitude voltage and having a polarity opposite to that of the low amplitude voltage to the detection resistor for a time period that is shorter than ½ of the driving cycle, and
    the variable control unit is configured such that
    when the low amplitude voltage is being applied, the variable control unit increases the time period for which the first high amplitude voltage is applied when the voltage value detected by the detection unit increases, and decreases the time period for which the first high amplitude voltage is applied when the voltage value detected by the detection unit decreases, and
    when the application of the low amplitude voltage is stopped, the variable control unit increases the time period for which the second high amplitude voltage is applied when the voltage value detected by the detection unit decreases, and decreases the time period for which the second high amplitude voltage is applied when the voltage value detected by the detection unit increases.

3. The electrical leakage determination device according to claim 2, wherein
    the first high amplitude voltage application unit includes a first switch that connects a first end of the detection resistor opposite to a second end thereof to which the capacitor is connected and a positive electrode of the battery, and applies the first high amplitude voltage to the detection resistor by turning on the first switch,
    the second high amplitude voltage application unit includes a second switch that connects the first end of the detection resistor opposite to the second end thereof to which the capacitor is connected and a negative electrode of the battery, and applies the second high amplitude voltage to the detection resistor by turning on the second switch, and
    the variable control unit is configured such that
    when the low amplitude voltage is being applied, the variable control unit increases a time period for which the first switch is ON when the voltage value detected by the detection unit increases, and decreases the time period for which the first switch is ON when the voltage value detected by the detection unit decreases, and
    when the application of the low amplitude voltage is stopped, the variable control unit increases a time period for which the second switch is ON when the voltage value detected by the detection unit decreases, and decreases the time period for which the second switch is ON when the voltage value detected by the detection unit increases.

4. The electrical leakage determination device according to claim 1, wherein the high amplitude voltage application unit is a first high amplitude voltage application unit, the high amplitude voltage is a first high amplitude voltage, the electrical leakage determination device further comprises a second high amplitude voltage application unit for applying, after the application of the low amplitude voltage is stopped, a second high amplitude voltage having a third amplitude higher than the amplitude of the low amplitude voltage and having a polarity opposite to that of the low amplitude voltage to the detection resistor for a time period that is shorter than ½ of the driving cycle, and the variable control unit is configured such that when the low amplitude voltage is being applied, the variable control unit increases the second amplitude when the voltage value detected by the detection unit increases, and decreases the second amplitude when the voltage value detected by the detection unit decreases, and when the application of the low amplitude voltage is stopped, the variable control unit increases the third amplitude when the voltage value detected by the detection unit decreases, and decreases the third amplitude when the voltage value detected by the detection unit increases.

* * * * *